US007548115B1

(12) United States Patent
Liu (10) Patent No.: US 7,548,115 B1
(45) Date of Patent: Jun. 16, 2009

(54) COMMON MODE REJECTION RATIO TRIM CIRCUIT AND METHODOLOGY

(75) Inventor: Hengsheng Liu, Colorado Springs, CO (US)

(73) Assignee: Linear Technology Corporation, Milpitas, CA (US)

( * ) Notice: Subject to any disclaimer, the term of this patent is extended or adjusted under 35 U.S.C. 154(b) by 20 days.

(21) Appl. No.: 11/524,197

(22) Filed: Sep. 21, 2006

(51) Int. Cl.
*H03F 3/45* (2006.01)
(52) U.S. Cl. ...................... 330/258; 330/253
(58) Field of Classification Search .............. 330/253, 330/9, 258
See application file for complete search history.

(56) References Cited

U.S. PATENT DOCUMENTS

| 4,639,683 | A | 1/1987 | Counts et al. |
| 5,418,491 | A | 5/1995 | Bowers |
| 5,424,677 | A | 6/1995 | Carson |
| 5,726,597 | A * | 3/1998 | Petty et al. ................ 327/307 |
| 6,420,932 | B1 | 7/2002 | Casper |
| 6,636,111 | B1 | 10/2003 | Gross et al. |
| 6,680,627 | B2 | 1/2004 | Hughes |
| 6,756,841 | B2 | 6/2004 | Jaussi et al. |
| 6,819,170 | B1 | 11/2004 | Kindt |
| 7,193,464 | B2 * | 3/2007 | Wang et al. ............... 330/253 |
| 7,358,809 | B2 * | 4/2008 | Elder ....................... 330/253 |
| 2005/0134380 | A1 | 6/2005 | Nairn |

* cited by examiner

*Primary Examiner*—Robert Pascal
*Assistant Examiner*—Hieu P Nguyen
(74) *Attorney, Agent, or Firm*—McDermott Will & Emery LLP (57) ABSTRACT

An operational amplifier circuit includes an input differential circuit and a trim circuit for sensing the operational amplifier's input common mode voltage and generating an offset correction voltage in response thereto. The trim circuit reduces the amplifier's offset voltage dependence on input common mode voltage, and hence improves the common mode rejection ratio of the operational amplifier circuit.

26 Claims, 7 Drawing Sheets

COMMON MODE REJECTION RATIO TRIM CIRCUIT AND METHODOLOGY

TECHNICAL FIELD

The subject matter of this disclosure relates to amplifiers, and more particularly to circuitry and methodology for trimming the common mode rejection ratio (CMRR) of an amplifier so as to have low offset variation throughout a specified common mode range of the amplifier.

BACKGROUND

Differential amplifiers are commonly used in various applications. A characteristic of such amplifiers is the ability of the amplifier to reject the input common mode signal, termed common mode rejection ratio, CMRR. A large CMRR is important in precision applications, such as in instrumentation. CMRR of an ideal amplifier is said to be infinite throughout its entire range of operation. However, practical amplifiers have CMRR specifications that are finite, with value that depends upon quality of internal circuitry and component tolerances which together tend to generate an offset. Amplifier offset varies with common mode input voltage. It would be advantageous to trim CMRR so as to improve amplifier performance.

SUMMARY OF THE DISCLOSURE

As the offset voltage of a practical application changes with input common mode voltage, the amplifier has limited CMRR. Circuitry of various embodiments is implemented to reduce dependence of offset voltage on the input common mode voltage, therefore improve CMRR. Applicability is generic to bipolar, JFET and CMOS technology.

In accordance with one aspect of the disclosure, a method of improving CMRR in an amplifier involves generating an offset correction voltage in response to the amplifier's input common mode voltage; and implementing the compensating voltage to reduce dependence of the offset voltage on the common mode voltage. The correction voltage can be proportional to amplifier's input common mode voltage and can cancel the linear term of the amplifier's uncorrected offset voltage versus common mode voltage function. The common mode voltage may be sensed by monitoring the two differential inputs of the amplifier.

In accordance with another aspect of the disclosure, an operational amplifier circuit having improved CMRR performance comprises a differential input circuit, a trim circuit sets the polarity and magnitude of the compensating voltage so that it cancel out the amplifier's offset change when the input common mode voltage changes.

The operational amplifier may have an automatic calibration arrangement for improving the CMRR. The automatic calibration arrangement may include a control circuit for selecting the polarity and adjusting the magnitude of the compensating voltage. In stead of trimming the CMRR at production, the operational amplifier can calibrate its CMRR at power on or per request.

In accordance with an embodiment of the disclosure, the trim circuit comprises a sensing circuit to tract the operational amplifier's input common mode voltage, a voltage scaling circuit such to scale the detected common mode voltage, a differential pair to receive the scaled common mode voltage and convert it to the offset compensating voltage, a multiplexer to set the polarity of the compensating voltage. The multiplexer may be connected to the input or the output of the differential pair.

Additional advantages and aspects of the disclosure will become readily apparent to those skilled in the art from the following detailed description, wherein embodiments of the present disclosure are shown and described, simply by way of illustration of the best mode contemplated for practicing the present disclosure. As will be described, the disclosure is capable of other and different embodiments, and its several details are susceptible of modification in various obvious respects, all without departing from the spirit of the disclosure. Accordingly, the drawings and description are to be regarded as illustrative in nature, and not as limitative.

BRIEF DESCRIPTION OF THE DRAWINGS

The following detailed description of the embodiments of the present disclosure can best be understood when read in conjunction with the following drawings, in which the features are not necessarily drawn to scale but rather are drawn as to best illustrate the pertinent features, wherein.

DETAILED DISCLOSURE OF THE EMBODIMENTS

The present disclosure will be made using the example of a CMOS operational amplifier. It will become apparent, however, that the concept of the disclosure is applicable to circuits implemented in JFET and bipolar technology.

Figure 1:
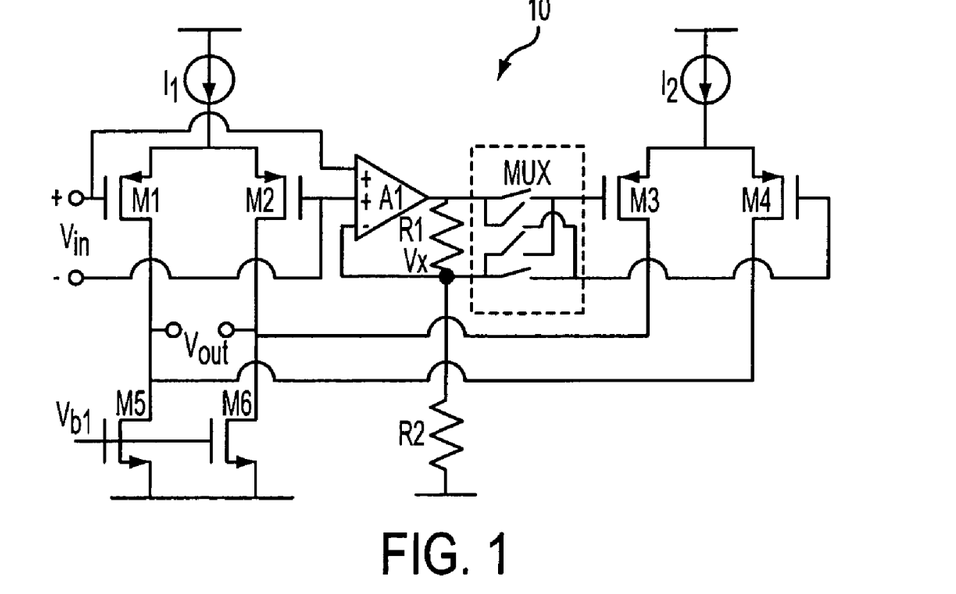
FIG. 1 shows an exemplary embodiment of the present disclosure.

FIG. 1 shows a front stage of an exemplary operational amplifier 10 of the present disclosure, which has a trim circuit generating an offset correction voltage proportional to the input common mode voltage of the amplifier. The correction voltage is applied to reduce or cancel out the linear term in the amplifier's offset voltage versus input common mode voltage function, making its offset voltage Vos less dependent on its common mode voltage and improving CMRR.

The front stage of the operational amplifier 10 comprises an input differential pair composed of transistors M1, M2, and a CMRR trim circuit. The CMRR trim circuit comprise a dual-input differential amplifier A1 to sense the input common mode voltage of the amplifier 10, voltage divider formed by resistor R1 and R2, a multiplexer MUX, and a second differential pair composed of transistors M3 and M4. Tail current sources I1 and I2 are coupled to the differential pairs M1, M2 and M3, M4 respectively. Also, the operational amplifier 10 may include load transistors M5 and M6 supplied with bias voltage Vb1. Gates of the transistors M1 and M2 are connected to the "+" and "−" inputs of the operational amplifier 10, respectively. A pair of non-inverting inputs of the common mode voltage sensing amplifier A1 also is connected to the "+" and "−" inputs of the operational amplifier 10. The inverting input of the amplifier A1 is connected to the node between R1 and R2. The output of A1 is connected to the top end of R1. The transistors M1 to M4 may be PMOS transistors, and the transistors M5 and M6 may be NMOS transistors.

Via the multiplexer MUX, the output and the inverting input of the amplifier A1 are connected to the gates of the transistors M3 and M4. The multiplexer MUX may be controlled to change the polarity of the input differential voltage applied to the gates of the differential pair M3, M4. In particular, when the multiplexer MUX is placed in a first state, the output of the amplifier A1 is connected to the gate of the transistor M3, whereas the inverting input of A1 is coupled to the gate of the transistor M4. When the multiplexer MUX is controlled to reverse polarity of the offset voltage Vos, the output of A1 is connected to the gate of the transistor M4, whereas the inverting input of A1 is coupled to the gate of the transistor M3.

The voltage Vx at the node between R1 and R2 is equal to the input common mode voltage Vcm of the amplifier 10. The voltage across resistor R1 is equal to:

$$V_{R1} = \frac{R_1}{R_2} V_x = \frac{R_1}{R_2} V_{cm}. \tag{1}$$

The trim differential pair M3, M4 generates offset trim voltage $V_{os\_trim}$ added to the pre-trim offset voltage $V_{os}$ to offset or cancel its linear dependence on Vcm. This trim voltage can be presented as follows:

$$V_{os\_trim} = \pm \frac{g_{m3,4}}{g_{m1,2}} V_{R1} = \pm \frac{g_{m3,4} R_1}{g_{m1,2} R_2} V_{cm}, \tag{2}$$

where $g_{m1,2}$ and $g_{m3,4}$ are transconductances of the differential pairs M1, M2 and M3, M4, respectively.

Figure 2A:
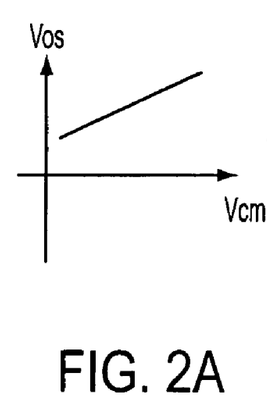
FIGS. 2a-2c illustrate correction for a change in the offset voltage when the common mode voltage changes in accordance with the present disclosure.

The sign "+" or "−" in the equation (2) is determined by the multiplexer MUX depending on whether the pre-trim offset voltage Vos increases or decreases when the common mode voltage Vcm increases. For example, FIG. 2a illustrates the pre-trim Vos increases with increase of Vcm. In this case, the multiplexer MUX is controlled to set the "−" sign in the equation (2) to produce $$V_{os\_trim} = -\frac{g_{m3,4} R_1}{g_{m1,2} R_2} V_{cm} \tag{3}$$

Figure 2B:
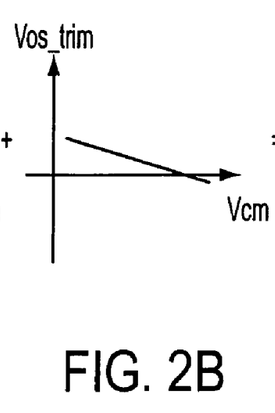
Figure 2C:
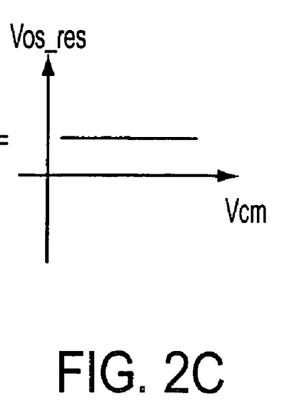

This function is illustrated in FIG. 2b. The slope of the $V_{os\_trim}$ can be adjusted by trimming R1, R2 or $g_{m3,4}$. As shown in FIG. 2c, the resulting offset voltage $Vos_{res}$ is made substantially independent of the common mode voltage Vcm, allowing the CMRR value to be substantially increased.

If the offset voltage decreases with an increase of Vcm, the multiplexer MUX is controlled to produce $$V_{os\_trim} = +\frac{g_{m3,4} R_1}{g_{m1,2} R_2} V_{cm} \tag{4}$$

Figure 3:
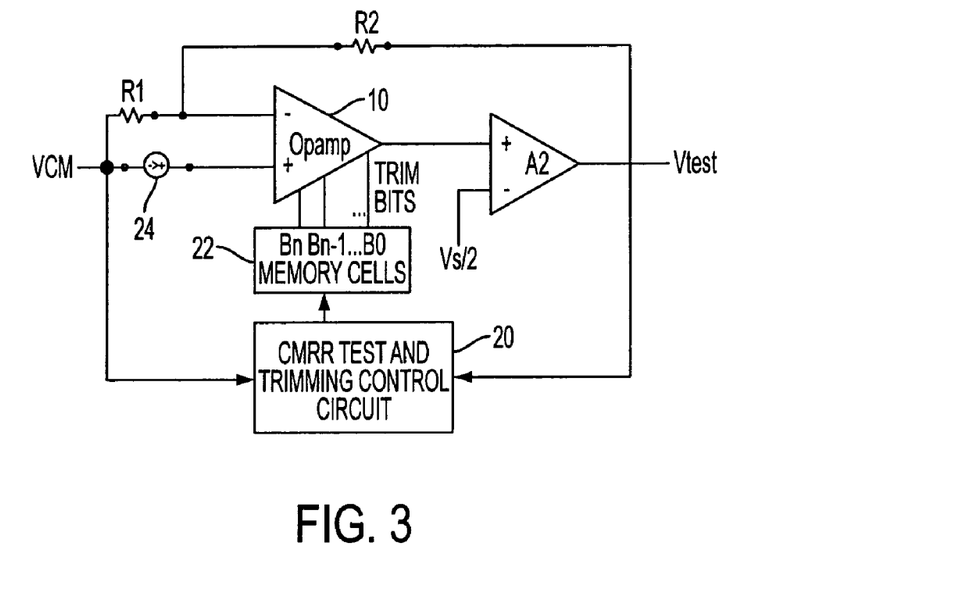
FIG. 3 illustrates testing and trimming control arrangement of the present disclosure.

FIG. 3 shows a test and trim arrangement of the present disclosure. As known in the prior art, the operational amplifier 10, amplifier A2, and resistors R1, R2 form a servo loop to test operational amplifier parameters such as Vos, CMRR. The non-inverting input of the amplifier A2 is coupled to the output of the operational amplifier 10. The inverting input of the amplifier A2 may be supplied with half of the supply voltage, Vs/2 to set the output voltage of operational amplifier 10 around half supply voltage. $V_{test}$ at the output of A2 is Vos of the amplifier 10 multiplied by $$\left(1 + \frac{R_4}{R_3}\right).$$

The CMRR test and trimming control circuit 20 tests the Vos and determines sign and magnitude of the offset correction voltage through digital bits $B_n B_{n-1} \ldots B_0$, where $B_n$ is the sign bit to set the polarity of the MUX in FIG. 1, the other bits can be used to adjust various parameters of the operational amplifier 10 to change the magnitude of the correction voltage. The control bits may be held in memory cells 22. The memory cell can be fuses, registers or EPROM devices.

During the CMRR trimming procedure of the present disclosure, the CMRR test and trimming control circuit 20 can monitor Vos at output terminal Vtest of the amplifier A2 and the input common mode voltage Vcm applied to the "+" input of the operational amplifier 10.

For example, when Vcm=Vcm1, a first value Vos1 of the offset voltage is tested at Vtest terminal. When Vcm=Vcm2, where Vcm2 higher than Vcm1, a second value Vos2 of the offset voltage is tested. If Vos2 higher then Vos1, the CMRR test and trimming circuit 20 sets the control bit $B_n$ to establish the "−" sign in the equation (2) so as to provide the offset correction voltage $V_{os\_trim}$ decreasing with an increase in Vcm. However, if Vos2 is lower then Vos1, the control bit $B_n$ is set to establish the "+" sign in the equation (2) so that the offset correction voltage $Vos_{trim}$ increases with an increase in Vcm.

Then, the value of R1 (FIG. 1) may be adjusted to make offsets at Vcm1 and Vcm2 equal or close. R1 may be derived as follows:

$$V_{os2} - V_{os1} = V_{os\_trim2} - V_{os\_trim1} = \frac{g_{m3,4}}{g_{m1,2}} \frac{R_1}{R_2} (V_{cm2} - V_{cm1}) \tag{5}$$

Figure 4:
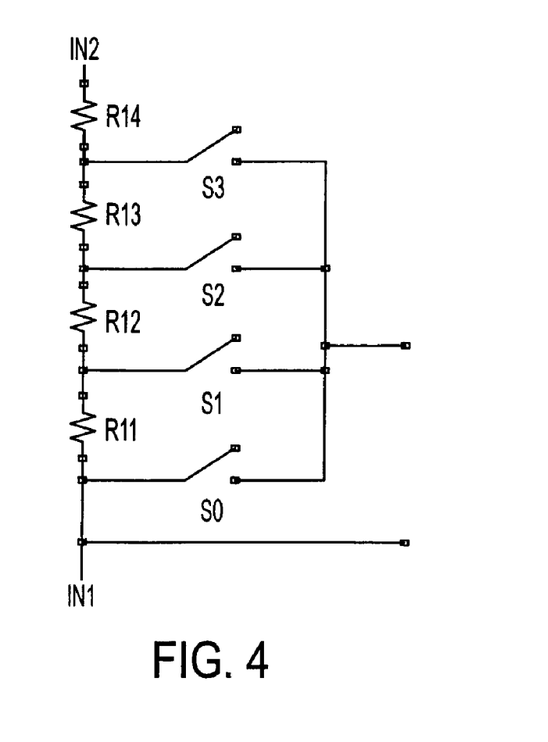
FIG. 4 illustrates resistance value control of the present disclosure.

The value of resistance R1 may be digitally set by the control bits $B_0$ to $B_{n-1}$ defined by the CMRR test and trimming circuit 20. For example, as shown in FIG. 4, the resistor R1 may be formed by four equal resistors R11, R12, R13 and R14 connected in series. Switches S0 to S3 coupled to the resistors may be controlled by the respective control bits $B_0$ to $B_3$ to select a desired value of the resistance R1. As one skilled in the art would understand, any number of resistors may be used to represent R1. Other methods such as successive approximation can be used to find the R1 value bit by bit, from the most significant bit to the least significant bit.

Moreover, instead of the digital resistance control illustrated in FIG. 4, various techniques may be utilized for adjusting the R1 value. For example, laser cut may be used. Further, instead of or in addition to adjusting R1, the transconductance the differential pair M3, M4 (FIG. 1), $g_{m3,4}$ may be adjusted to make Vos at Vcm1 and Vcm2 equal or close.

The CMRR trimming procedure of the present disclosure may be carried out during a production test. The test and trimming circuit 20, together with the associated test and control circuitry, may be included into a testing board or machine for testing the operational amplifier 10.

Alternatively, the operational amplifier 10 may be designed with CMRR automatic calibration. In this case, the CMRR test and trimming circuit 20 and the associated test and control circuitry may be incorporated into the operational amplifier 10. The automatic calibration including the CMRR trimming procedure described above may be carried out automatically at any desired moment during operation of the operational amplifier 10.

Figure 5:
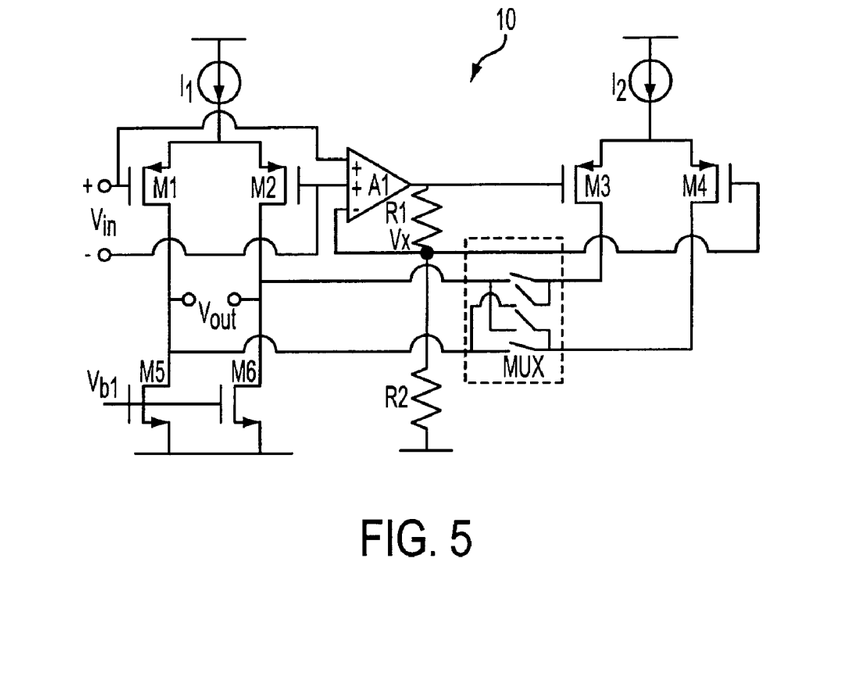
FIG. 5 shows another exemplary embodiment of the disclosure
Figure 6:
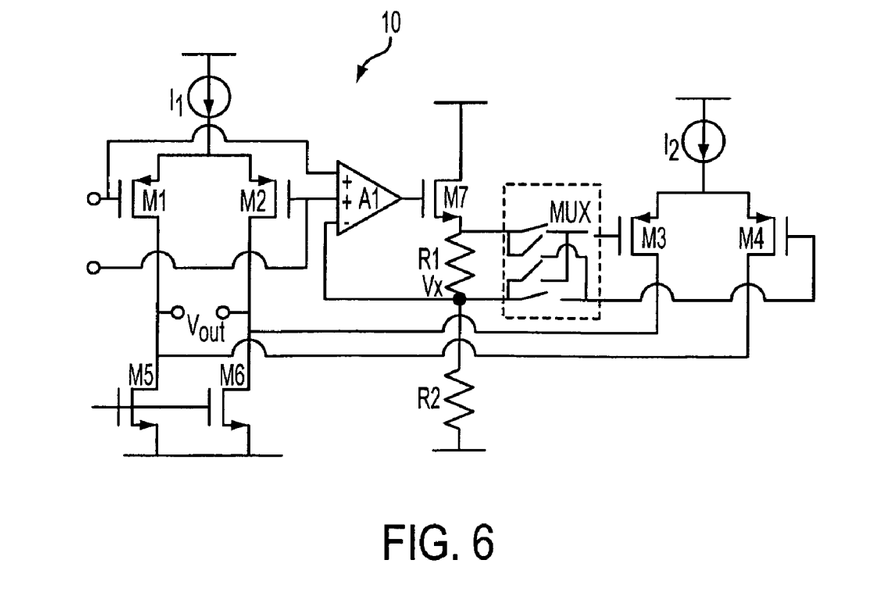
FIG. 6 shows a further exemplary embodiment of the disclosure.

FIG. 5 illustrates another embodiment of the present disclosure. By contrast with the embodiment shown in FIG. 1, the multiplexer MUX in FIG. 6 is connected between the drains of the transistors M1 and M2 and the drains of the transistors M3 and M4. Instead of controlling the polarity of a signal supplied to the inputs of the trim differential pair M3, M4 (as shown in FIG. 1), the multiplexer MUX in FIG. 6 enables the sign in the equation (3) to be set by controlling the polarity of a signal at the output of the trim differential pair M3, M4.

FIG. 6 shows a further embodiment of the present disclosure, in which output of the amplifier drives gate of NMOS M7, and source of M7 is coupled to the resistor divider R1 and R2. The transistor M7 enhances driving capabilities of A1. Via the multiplexer MUX, voltage across R1 may be connected to gates of the transistors M3 and M4. The multiplexer MUX may be controlled to change the polarity of an input differential voltage applied to the gates of the differential pair M3, M4 in order to set the sign in the equation (3).

Figure 7:
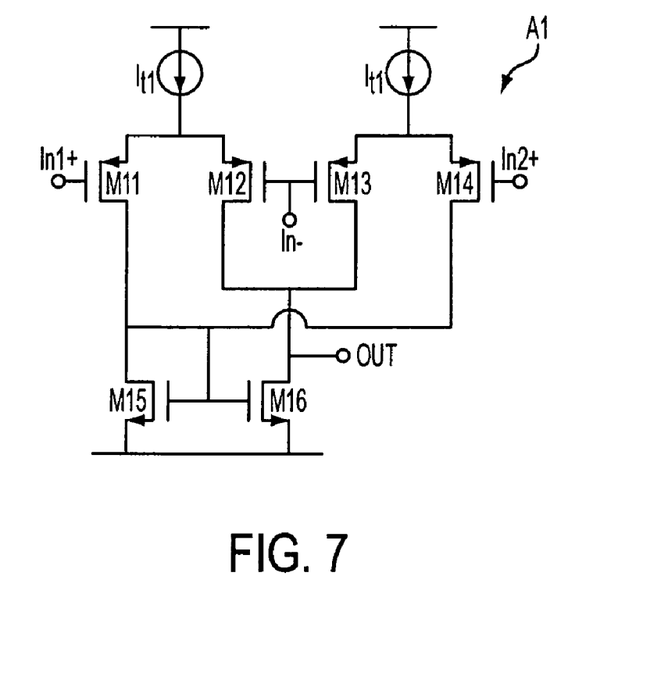
FIG. 7 illustrates an exemplary embodiment of the common mode sensing amplifier shown in FIGS. 1, 5 and 6.

FIG. 7 illustrates an exemplary embodiment of the common mode sensing amplifier A1 shown in FIGS. 1, 5 and 6. This amplifier may have two non-inverting inputs In1+ and In2+, and an inverting input In−. The amplifier A1 includes a first differential circuit composed of PMOS transistors M11 and M12, and a second differential circuit composed of PMOS transistors M13 and M14. The gates of the transistors M11 and M14 are driven by the non-inverting inputs In1+ and In2+, respectively. The gates of the transistors M12 and M13 are connected to the inverting input In−. The amplifier A1 may also include load NMOS transistors M15 and M16 having gates driven by the drains of the transistors M1 and M14. An output of the amplifier A1 may be provided at the drain of the transistor M16. Current sources It1 may be connected to the differential pairs M11, M12 and M13, M14.

Figure 8:
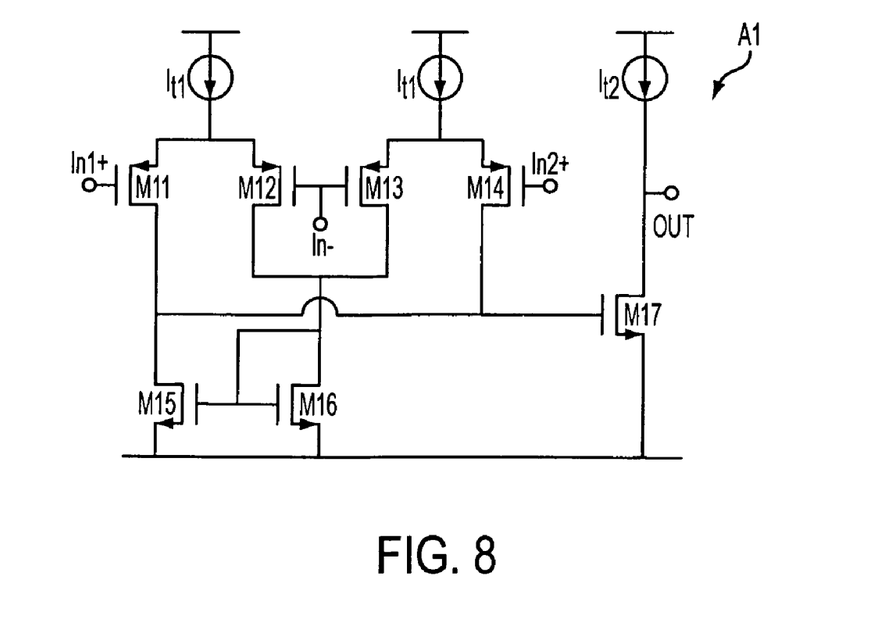
FIG. 8 illustrates another exemplary embodiment of the common mode voltage sensing amplifier shown in FIGS. 1, 5 and 6.

FIG. 8 illustrates another exemplary embodiment of the common mode sensing amplifier A1, in which a second stage including an NMOS transistor M17 is added to the first stage composed of the differential pairs M11, M12, and M13, M14. A current source It2 may be connected to the transistor M17. A rail-to-rail output of the amplifier A1 can be provided at the output of the transistor M17.

Figure 9:
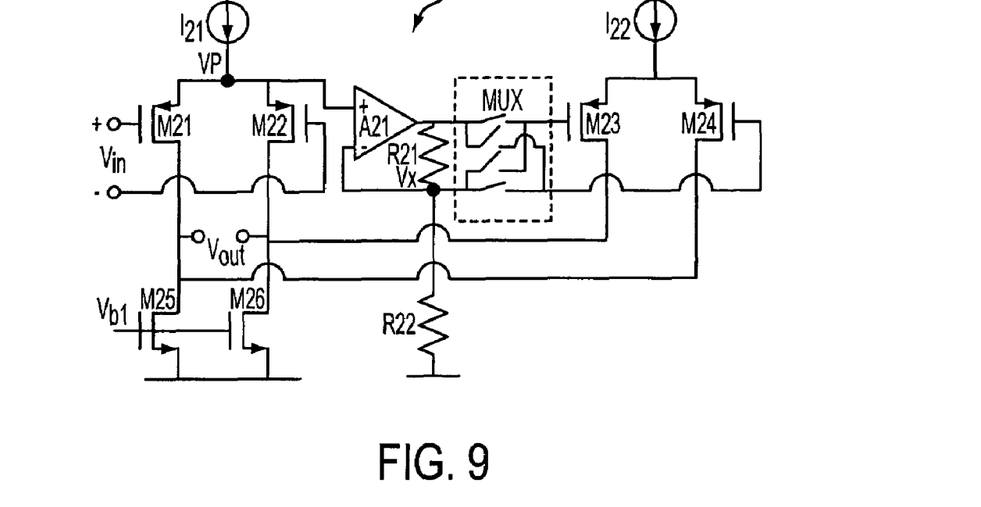
FIG. 9 shows a further exemplary embodiment of the disclosure.

FIG. 9 illustrates a further exemplary embodiment of the present disclosure, in which the front stage of the operational amplifier 10 comprises an input differential circuit composed of PMOS transistors M21 and M22, a common mode sensing differential amplifier A21 having one non-inverting and one inverting inputs, resistors R21 and R22, a multiplexer MUX, a trim differential circuit composed of PMOS transistors M23 and M24, and load NMOS transistors M25 and M26. Current sources 121 and 122 are respectively coupled to the input differential pair M21, M22 and the trim differential pair M23, M24.

In the embodiment shown in FIG. 9, the input common mode voltage is being tracked at the node Vp coupled to the non-inverting input of the differential amplifier A21. The node Vx between the resistors R21 and R22 is connected to the inverting input of the amplifier A21 to track the voltage at the node Vp. Similarly to the embodiment in FIG. 1, the multiplexer MUX connects the output and the inverting input of the differential amplifier A21 to the gates of the transistors M23 and M24 to control the polarity of an input differential voltage applied to the gates of the differential pair M23, M24. However, one skilled in the art would understand that similarly to the arrangement in FIG. 5, the multiplexer MUX may also be connected between the drains of the transistors M21 and M22, and the drains of the transistors M23 and M24 to control the polarity of a signal at the output of the trim differential pair M23, M24.

Figure 10:
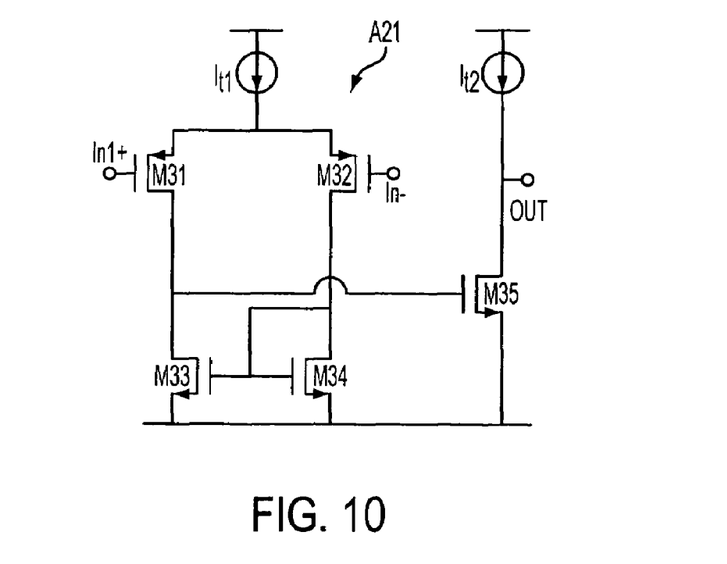
FIG. 10 illustrates an exemplary embodiment of the common mode voltage sensing amplifier shown in FIG. 9.

FIG. 10 illustrates an exemplary embodiment of the common mode sensing amplifier A21 shown in FIG. 9. For example, this amplifier may comprise the first stage including a differential circuit composed of PMOS transistors M31 and M32. The non-inverting and inverting inputs In+ and In− of the amplifier A21 may drive the gates of the transistors M31 and M32, respectively. The load NMOS transistors M33 and M34 are coupled to the drains of the transistors M31 and M32. The second stage of the amplifier A21 includes an NMOS transistor M35 having the gate driven by the drain of the transistor M31. The output may be provided at the output of the transistor M35.

Figure 11:
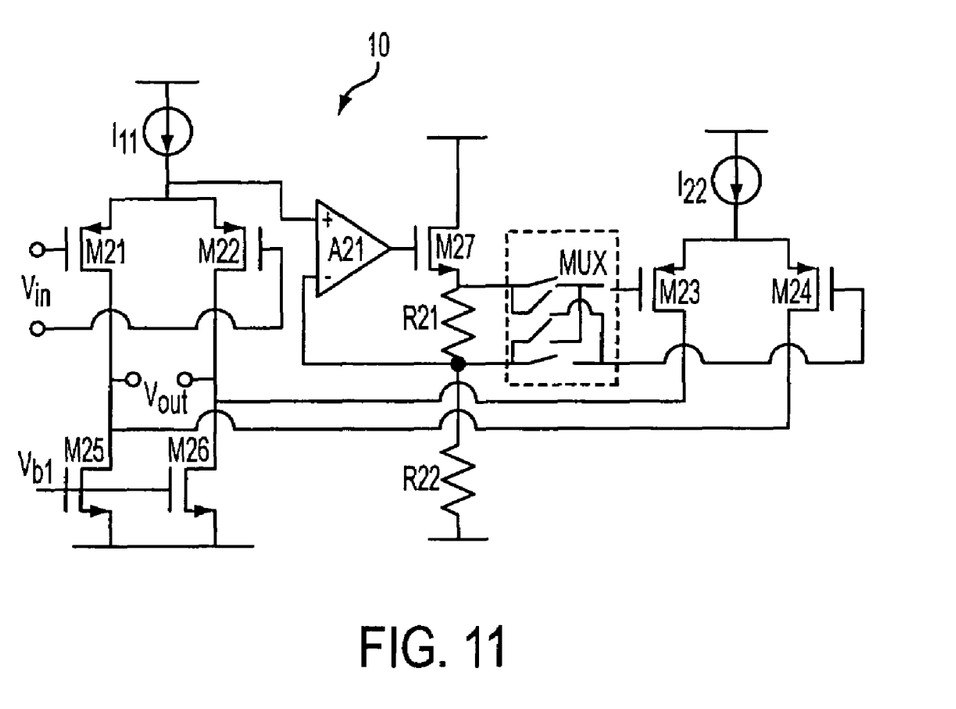
FIG. 11 shows another exemplary embodiment of the disclosure.

FIG. 11 illustrates another embodiment of the present disclosure, which is a modification of the embodiment shown in FIG. 9. To enhance driving capabilities of the common mode sensing amplifier. The output of the amplifier A21 in FIG. 11 drives the gate of a PMOS transistor M27. Via the multiplexer MUX, the output of the transistor M27 and the inverting input of the differential amplifier A1 may be connected to gates of the transistors M23 and M24 to control the polarity of an input differential voltage applied to the trim differential pair M23, M24 in order to set the sign in the equation (3).

Figure 12:
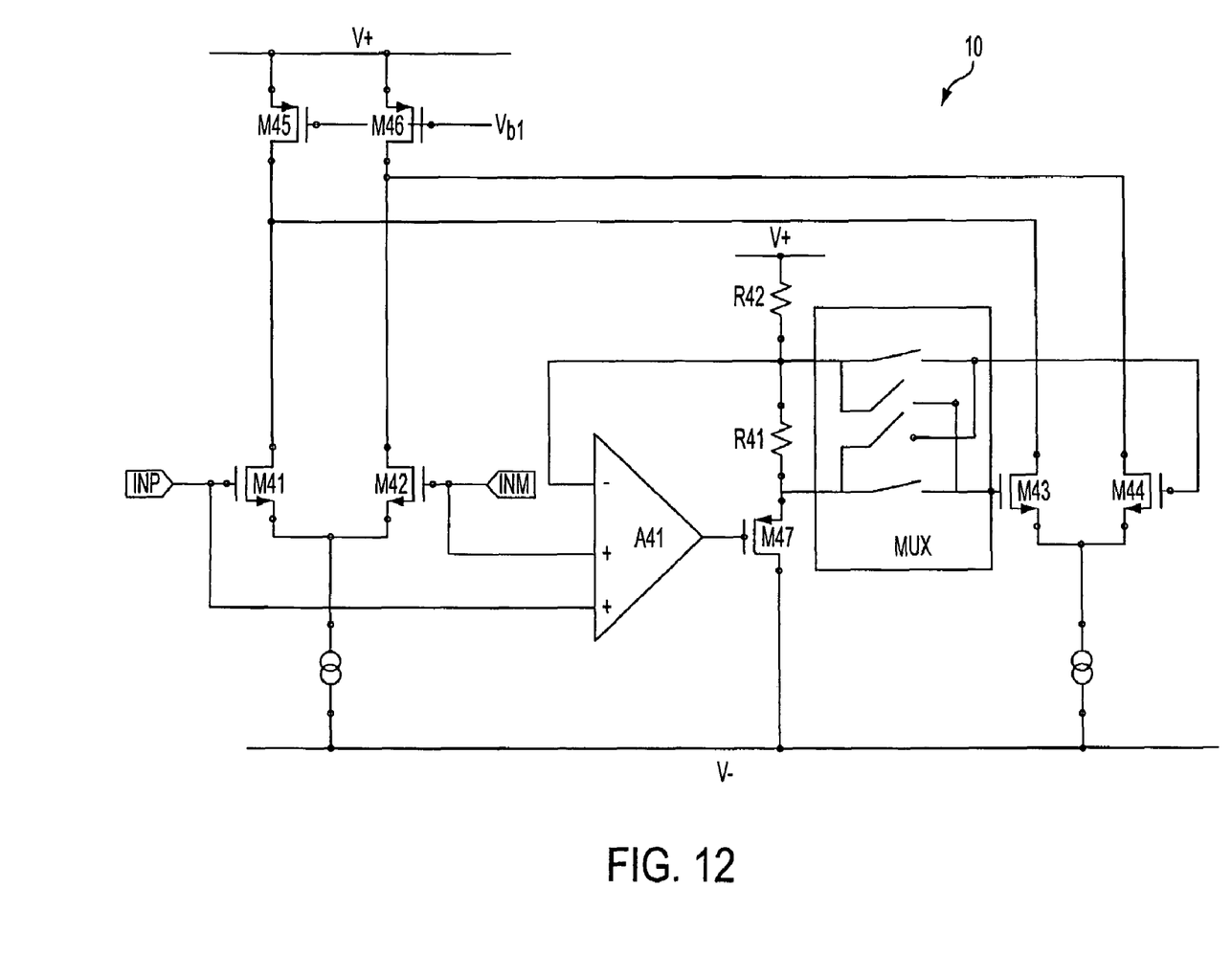
FIG. 12 shows a further exemplary embodiment of the disclosure.

FIG. 12 illustrates a further exemplary embodiment of the operational amplifier 10. This embodiment is similar to the embodiment shown in FIG. 6, however, the input and trim differential pairs of the front stage are composed of NMOS transistors instead of PMOS transistors. In particular, the front stage of the operational amplifier 10 in FIG. 12 comprises an input differential circuit composed of NMOS transistors M41 and M42, and a CMRR trim circuit. The CMRR trim circuit includes a common mode sensing amplifier A41, resistor divider formed by R41 and R42, a multiplexer MUX, and a second differential pair composed of NMOS transistors M43 and M44. The two non-inverting inputs of A41 are connected to the inputs of operational amplifier 10. the inverting input of A41 is connected to the node between R41 and R42. The output of A41 drive the gate of PMOS transistor M47. Current sources I1 and I2 are coupled to the differential pairs M41, M42 and M43, M44 respectively. Also, the operational amplifier 10 includes PMOS load transistors M45 and M46 supplied with bias voltage Vb1. Via the multiplexer MUX, the output of the transistor M47 and the inverting input of the differential amplifier A1 may be connected to gates of the transistors M43 and M44 to control the polarity of an input differential voltage applied to the trim differential pair M43, M44.

The foregoing description illustrates and describes aspects of the present invention. Additionally, the disclosure shows and describes only preferred embodiments, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art.

The embodiments described hereinabove are further intended to explain best modes known of practicing the invention and to enable others skilled in the art to utilize the invention in such, or other, embodiments and with the various modifications required by the particular applications or uses of the invention.

Accordingly, the description is not intended to limit the invention to the form disclosed herein. Also, it is intended that the appended claims be construed to include alternative embodiments.

What is claimed is:

1. A method of improving CMRR in an amplifier having an offset voltage, comprising the steps of:
   generating an offset correction voltage that varies in response to an input common mode voltage of the amplifier having a differential input circuit including first and second transistors; and
   applying the offset correction voltage to drains of the first and second transistors to reduce dependence of the offset voltage from the input common mode voltage.

2. A method as recited in claim 1, in which the offset correction voltage is proportional to the input common mode voltage of the amplifier.

3. A method as recited in claim 1, wherein the offset correction voltage is implemented to cancel a linear dependence of offset voltage on the input common mode voltage of the amplifier.

4. A method as recited in claim 2, including determining the sign of the slope of offset correction voltage in response to the input common mode voltage, and responsively implementing the offset correction voltage to reduce the change in the amplifier's offset voltage when its input common mode voltage changes.

5. A method as recited in claim 1, including sensing the common mode voltage by monitoring differential inputs of the amplifier.

6. A method as recited in claim 4, wherein determining the sign of the offset correction voltage includes measuring amplifier offset voltages at two different input common voltages.

7. An operational amplifier circuit having improved CMRR performance, comprising:
   a differential input circuit including first and second transistors, and
   a trim circuit configured to sense an input common mode voltage of the amplifier and produce an offset correction voltage that varies in response thereto, the offset correction voltage being applied to drains of the first and second transistors.

8. A circuit as recited in claim 7, further including a multiplexer connected to set the sign of the offset correction voltage.

9. A circuit as recited in claim 8, wherein the trim circuit comprises a differential amplifier circuit having first and second non-inverting inputs connected to respective differential inputs of the operational amplifier circuit, and an inverting input and an output connected to a voltage scaling circuit.

10. A circuit as recited in claim 9, wherein the trim circuit includes a transistor for driving the voltage scaling circuit.

11. A circuit as recited in claim 9, wherein the trim circuit comprises a single non-inverting input connected to sources of the differential input pair, and a single inverting input connected to the voltage scaling circuit.

12. A circuit as recited in claim 11, wherein the trim circuit comprises a first stage including a differential circuit controlled by the inverting and non-inverting inputs, and a second stage including a transistor controlled by an output of the first stage.

13. A circuit as recited in claim 7, wherein the differential input circuit includes a first pair of PMOS transistors, and the trim circuit includes a second pair of PMOS transistors.

14. A circuit as recited in claim 7, wherein the differential input circuit includes a first pair of NMOS transistors, and the trim circuit includes a second pair of NMOS transistors.

15. A circuit as recited in claim 7, further including an automatic calibration arrangement for improving the CMRR.

16. A circuit as recited in claim 15, wherein the automatic calibration arrangement includes a control circuit for selecting polarity of the offset correction voltage.

17. A circuit as recited in claim 15, wherein the automatic calibration arrangement includes a control circuit for adjusting parameters of the operational amplifier circuit to select a value of the offset correction voltage.

18. An operational amplifier circuit having improved CMRR performance, comprising:
   a differential input circuit,
   a trim circuit configured to sense an input common mode voltage of the amplifier and produce an offset correction voltage that varies in response thereto, and
   a multiplexer connected to set the sign of the offset correction voltage,
   wherein the trim circuit comprises a differential amplifier circuit having first and second non-inverting inputs connected to respective differential inputs of the operational amplifier circuit, and an inverting input and an output connected to a voltage scaling circuit, and
   the differential amplifier circuit comprises a first differential circuit responsive to the first non-inverting input and the inverting input, and a second differential circuit responsive to the second non-inverting input and the inverting input.

19. A circuit as recited in claim 18, wherein the multiplexer is interposed between the voltage scaling circuit and an input of the second differential circuit.

20. A circuit as recited in claim 18, wherein the multiplexer is interposed between outputs of input differential circuit and the second differential circuit.

21. An operational amplifier circuit having improved CMRR performance, comprising:
   a differential input circuit,
   a trim circuit configured to sense an input common mode voltage of the amplifier and produce an offset correction voltage that varies in response thereto, and
   a multiplexer connected to set the sign of the offset correction voltage,
   wherein the trim circuit comprises a differential amplifier circuit having first and second non-inverting inputs connected to respective differential inputs of the operational amplifier circuit, and an inverting input and an output connected to a voltage scaling circuit, and
   the differential amplifier circuit comprises multiple stages.

22. A circuit as recited in claim 21, wherein the differential amplifier circuit comprises a first stage including a first differential circuit responsive to the first non-inverting input and the inverting input, and a second differential circuit responsive to the second non-inverting input and the inverting input; and a second stage having a transistor controlled by an output of the first stage.

23. An operational amplifier circuit having improved CMRR performance, comprising:
a differential input circuit,
a trim circuit configured to sense an input common mode voltage of the amplifier and produce an offset correction voltage that varies in response thereto, and
a multiplexer connected to set the sign of the offset correction voltage,
wherein the trim circuit comprises a differential amplifier circuit having first and second non-inverting inputs connected to respective differential inputs of the operational amplifier circuit, and an inverting input and an output connected to a voltage scaling circuit, and
the trim circuit comprises a second differential circuit for generating the offset correction voltage to the differential input circuit.

24. A circuit as recited in claim 23, wherein the trim circuit includes an output scaling circuit for scaling magnitude of sensed input common mode voltage supplied to the second differential circuit.

25. A circuit as recited in claim 24, wherein the scaling circuit comprises a resistance divider circuit at the output of the differential amplifier circuit.

26. A circuit as recited in claim 25, wherein the resistance divider circuit includes at least one resistor having a resistance value adjustable to provide a desired value of compensating voltage.

* * * * *